(12) United States Patent
Na et al.

(10) Patent No.: US 8,496,426 B2
(45) Date of Patent: Jul. 30, 2013

(54) PICK AND PLACE APPARATUS FOR ELECTRONIC DEVICE INSPECTION EQUIPMENT, PICKING APPARATUS THEREOF, AND METHOD FOR LOADING ELECTRONIC DEVICES ONTO LOADING ELEMENT

(75) Inventors: Yun-Sung Na, Cheunan (KR); In-Gu Jeon, Suwon (KR); Dong Hyun Yo, Bucheon-si (KR); Young-Chul Lee, Daejeon (KR)

(73) Assignee: TechWing., Co. Ltd., Hwaseong-si (KR)

( * ) Notice: Subject to any disclaimer, the term of this patent is extended or adjusted under 35 U.S.C. 154(b) by 537 days.

(21) Appl. No.: 12/794,975

(22) Filed: Jun. 7, 2010

(65) Prior Publication Data

US 2011/0008144 A1   Jan. 13, 2011

(30) Foreign Application Priority Data

Jul. 13, 2009   (KR) .................. 10-2009-0063752

(51) Int. Cl.
    *B25J 15/06*   (2006.01)
(52) U.S. Cl.
    USPC ............... 414/749.1; 294/87.1; 198/468.2; 324/757.01; 901/16

(58) Field of Classification Search
    USPC ............ 414/749.1, 806; 294/87.1; 198/468.2; 324/757.01; 901/16
    See application file for complete search history.

(56) References Cited

U.S. PATENT DOCUMENTS

| | | | | |
|---|---|---|---|---|
| 4,631,815 A | * | 12/1986 | Bocchicchio et al. | ......... 29/739 |
| 5,742,487 A | | 4/1998 | Kobayashi et al. | |
| 6,339,321 B1 | * | 1/2002 | Yamashita et al. | ...... 324/757.01 |
| 6,636,060 B1 | * | 10/2003 | Saito | ........................ 324/756.02 |
| 6,831,296 B1 | * | 12/2004 | Lee et al. | ......................... 257/48 |
| 7,150,096 B1 | * | 12/2006 | Heater et al. | .................... 29/832 |
| 8,141,922 B2 | | 3/2012 | Shim et al. | |
| 2002/0153735 A1 | * | 10/2002 | Kress | .......................... 294/87.1 |

FOREIGN PATENT DOCUMENTS

| | | |
|---|---|---|
| CN | 1130257 A | 9/1996 |
| WO | 2008/004778 A1 | 1/2008 |

* cited by examiner

*Primary Examiner* — Scott Lowe
(74) *Attorney, Agent, or Firm* — Jefferson IP Law, LLP

(57) ABSTRACT

A technology related to a pick-and-place apparatus for electronic device inspection equipment is provided. The pick-and-place apparatus includes the guiding unit that can interact with a loading element and can guide the picker to load the electronic devices at a correct position on the loading element. Therefore, the pick-and-place apparatus can allow the electronic devices, for example, semiconductor devices having a ball type of electrical contact lead (BGA, FBGA, etc.), to electrically contact the tester in a stable manner when the tester inspects the electronic devices.

5 Claims, 23 Drawing Sheets

PICK AND PLACE APPARATUS FOR ELECTRONIC DEVICE INSPECTION EQUIPMENT, PICKING APPARATUS THEREOF, AND METHOD FOR LOADING ELECTRONIC DEVICES ONTO LOADING ELEMENT

PRIORITY

This application claims the benefit under 35 U.S.C. §119 (a) of a Korean patent application filed on Jul. 13, 2009 in the Korean Intellectual Property Office and assigned Serial No. 10-2009-0063752, the entire disclosure of which is hereby incorporated by reference.

BACKGROUND OF THE INVENTION

1. Field of the Invention

The present invention relates to test handlers. More particularly, the present invention relates to a technology that can be applied to carrier boards for loading semiconductor devices having a ball type of electrical contact lead (BGA, FBGA, etc.), in a pick-and-place apparatus for electronic device inspection equipment.

2. Description of the Related Art

Electronic devices such as, semiconductor devices are tested via a tester, when a test handler makes them electrically contact the tester.

Test handlers are closely related to technology involving electrical contact precision between electronic devices and the tester, temperature controllability, and an electronic device moving method. Of them, electrical contact precision is the most important factor. The present invention is related to how to guarantee electrical contact precision.

Semiconductor devices are electronic devices and their electrical contact leads are divided into a type of wire, for example, TSOP, SOP, TQFP, QFP, etc., and a type of ball, for example, BGA, FBGA, etc. It is very important that the electrical contact leads of the semiconductor device precisely contact the tester, irrespective of their type.

In particular, a semiconductor device having a ball type electrical contact lead exquisitely aligns a plurality of electrical contact leads on its underside, so the electrical contact leads may not electrically contact the tester if the semiconductor device is even slightly misaligned.

In general, test handlers transfer semiconductor devices via a carrier board (also called a test tray, a test board, or the like) and also allow the semiconductor devices loaded on the carrier board to electrically contact the tester.

A carrier board includes a plurality of inserts (also called a carrier, a carrier module, etc.) aligned in a matrix form. An insert loads one or more semiconductor devices thereon. A technology related to a carrier board and an insert was disclosed in Korean Patent Publication No. 10-2005-0009066 entitled "carrier module for semiconductor device test handlers," which is hereinafter referred to as a "well-known technology." This publication discloses the insert in which a BGA chip can be properly placed.

FIG. 1 is a view illustrating a conventional insert that loads semiconductor devices with BGA type electrical contact leads.

Referring to FIG. 1, the conventional insert forms a placement compartment 111 that corresponds in size to a semiconductor device in a loaded part 110 on which a semiconductor device is loaded. The bottom side of the placement compartment 111 is perforated so that the ball type of electrical contact leads of the placed semiconductor device can be electrically contacted with the tester.

In addition, the placement compartment 111 also forms grooves, corresponding to the shape and spacing of the balls of the semiconductor device, on the inner wall of the perforated bottom side thereof.

When a semiconductor device is appropriately placed in the placement compartment, the balls of the semiconductor device are inserted into the grooves of the placement compartment, so that the semiconductor device can be stably loaded on the loaded part 110.

Meanwhile, since the semiconductor devices loaded in the carrier board are electrically contacted with a tester, the test handler is equipped with a pick-and-place apparatus that can load semiconductor devices from a customer tray onto a carrier board or unload semiconductor devices from a carrier board onto a customer tray.

The pick-and-place apparatus includes a plurality of picking apparatuses each of which can pick and place one semiconductor device.

In general, a picking apparatus includes a picker that sucks and picks a semiconductor device according to vacuum pressure or places it by releasing the vacuum pressure.

The following description describes the transfer and loading methods of semiconductor devices in a conventional picking apparatus.

The picking apparatus sucks and picks semiconductor devices from a loading element A (which may be a customer tray, a buffer, an aligner, a carrier board, etc.) and is then moved up over a loading element B (which may be a customer tray, a buffer, an aligner, a carrier board, etc.). When the pick-and-place apparatus moves, the picking apparatuses are also moved. The pick-and-place apparatus is lowered a certain distance above the loading element B and then places the semiconductor devices thereon, so that the semiconductor devices can be dropped and loaded on the loading element B.

However, semiconductor devices with a ball type of electrical contact leads have a relatively narrow spacing between their electrical contact leads, so they can be easily misaligned in the carrier board due to an impact when the semiconductor devices are dropped or an impact accompanying an operation where the apparatuses hold the semiconductor devices. In that case, the semiconductor devices cannot be electrically contacted with the tester, which causes test failure.

SUMMARY OF THE INVENTION

An aspect of the present invention is to address at least the above-mentioned problems and/or disadvantages and to provide at least the advantages described below. Accordingly, an aspect of the present invention is to provide a pick-and-place apparatus that can load semiconductor devices on a loading element, without causing an impact when the semiconductor devices are placed, and irrespective of an impact accompanying the operation of a holding apparatus.

In accordance with an aspect of the present invention, an apparatus for electronic device inspection equipment is provided. The apparatus includes a plurality of picking apparatuses that pick up electronic devices loaded on one loading element (A), move the electronic devices, and unloads the electronic devices onto another loading element (B), and a module-forming block that joins the plurality of picking apparatuses in one module. At least one picking apparatus includes: a body fixed to the module-forming block, a picker having a picking unit, coupled to the body, for picking up an electronic device or releasing the picked electronic device, and a guiding unit for interacting with another loading element (B) and for guiding the picker to load the electronic devices at a correct position on another loading element (B).

Preferably, the guiding unit comprises a guiding member having position setting pins, joined to the body, for setting positions between the picker and another loading element (B) by being inserted into position setting holes formed in another loading element (B).

Preferably, the guiding member is joined to the body so that it can be relatively moved within a preset range of movement distance with respect to the body in the direction of another loading element (B) or opposite thereto. The guiding unit further includes an elastic member (C) exerting an elastic force on the guiding member toward another loading element (B).

Preferably, at least one picking apparatus further includes another elastic member (D) for maintaining an elastic force with respect to the module-forming block, another elastic member being joined so that it can be relatively moved within a preset range of movement distance with respect to the module-forming block in the direction toward another loading element (B) or opposite thereto. Another elastic member (D) has a greater elastic coefficient than the one elastic member (C) does.

Preferably, at least one picking apparatus further includes another elastic member (D) for maintaining an elastic force with respect to the module-forming block. Another elastic member is joined so that it can be relatively moved within a preset range of movement distance with respect to the module-forming block in the direction toward another loading element (B) or in the opposite direction thereto.

Preferably, the pick-and-place apparatus may further include coupling pins with a head and a coupling part for coupling at least one picking apparatus to the module-forming block, in which the coupling part forms a thread on at least one end portion thereof. The module-forming block forms coupling through-holes for coupling at least one picking apparatus therewith, and the body forms a threaded hole into which the coupling part of the coupling pin passing through the coupling through-hole is screwed.

Preferably, the coupling part has an external diameter smaller than its internal diameter of coupling through-hole.

Preferably, the picking apparatus is coupled to the module-forming block in a certain range of angle with respect to a straight line passing through the module-forming block, the picking apparatus, and another loading element (B).

In accordance with another aspect of the present invention, an apparatus of a pick-and-place apparatus for electronic device inspection equipment is provided. The apparatus includes: a body fixed to a module-forming block of the pick-and-place apparatus, a picker having a picking unit, coupled to the body, for picking up an electronic device or releasing the picked electronic device, and a guiding unit for interacting with a loading element and for guiding the picker to load the electronic devices at a correct position on the loading element.

Preferably, the guiding unit comprises a guiding member having position setting pins, joined to the body, for setting positions between the picker and the loading element by being inserted into position setting holes formed in the loading element.

Preferably, the guiding members include a plurality of position setting pins.

Preferably, the position setting pin is formed in such a way that its one end protrudes more toward the loading element than one end of the picking unit of the picker, so that the position pin can first set a position between the picker and the loading element before the semiconductor device, picked up by the picking unit, is placed in a carrier board.

Preferably, the guiding member is joined to the body so that it can be relatively moved within a preset range of movement distance with respect to the body in the direction of the loading element or opposite thereto. The guiding unit further includes an elastic member exerting an elastic force on the guiding member toward the loading element.

In accordance with still another aspect of the present invention, an aligner for inspection equipment of electronic devices is provided. The aligner is formed with a plurality of aligning grooves in which semiconductor devices are aligned and placed and pin receiving walls that are protrudent at both sides of the aligning groove. The pin receiving walls form pin receiving holes into which position setting pins of a pick-and-place apparatus are inserted.

In accordance with yet another aspect of the present invention, a method for loading electronic devices onto a loading element in electronic device inspection equipment is provided. The method includes: releasing a holding state of a holding apparatus installed to a loading element on which electronic devices are loaded, moving the pick-and-place apparatus toward the loading element and setting a position between the loading element and a picker that picks up an electronic device, placing the electronic device, picked up by the picker, in the loading element and holding the placed electronic device, releasing the picking state of the picker, and moving the pick-and-place apparatus in the direction opposite to the loading element.

Preferably, placing the electronic device and holding the placed electronic device includes: placing the electronic device, picked up by the picker, in the loading element, moving additionally the picker by a distance corresponding to a distance by which the loading element is retroceded in the same direction as the pick-and-place apparatus moves, so that the electronic device can remain in the loading element, and holding the electronic device.

Preferably, the method may further include loading different electronic devices on the loading element, only if the different electronic devices have the same type and position of electrical contact lead as the electronic devices.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

BRIEF DESCRIPTION OF SYMBOLS IN THE DRAWINGS

Figure 1:
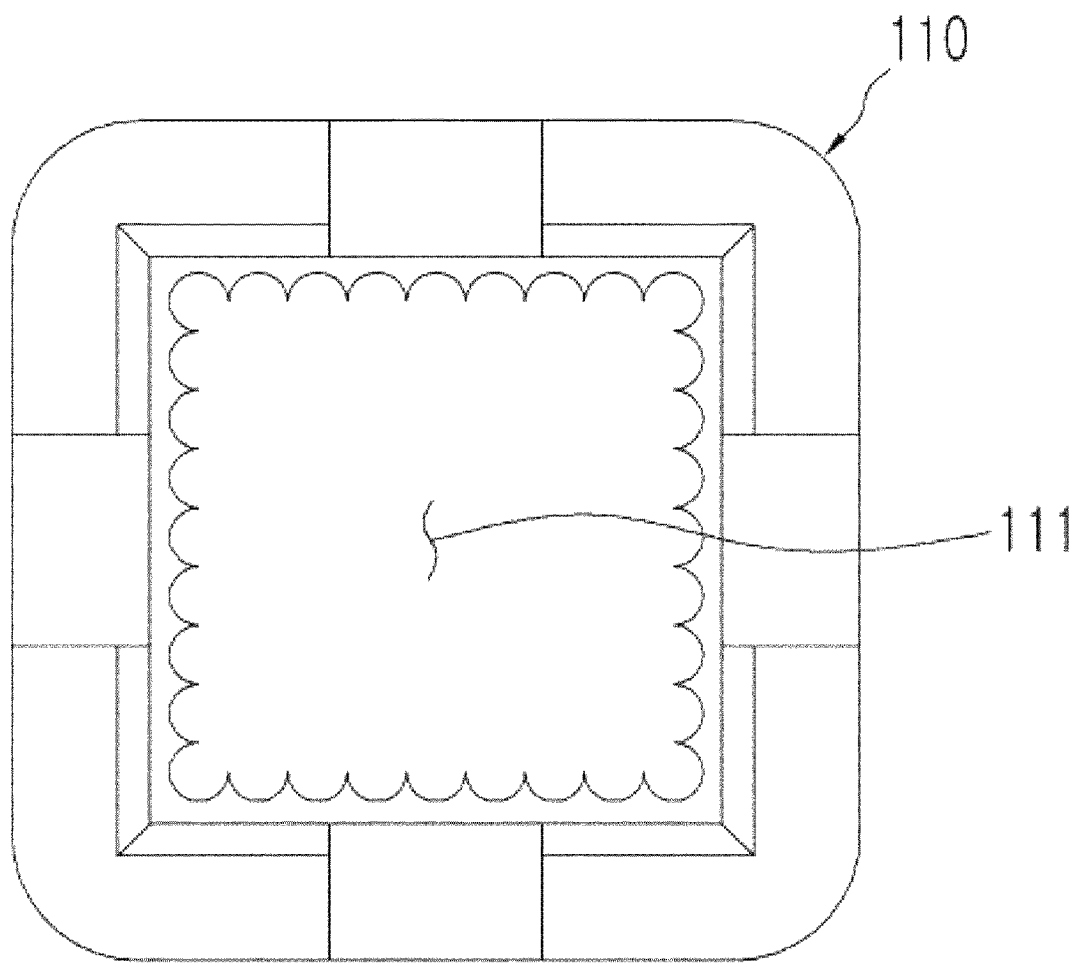
FIG. 1 is a view illustrating a conventional insert that loads semiconductor devices with BGA type electrical contact leads.

200: pick-and-place apparatus
210: picking apparatus
211: body
211a: threaded hole
212: picker
212a: holding unit
213: guiding unit
213a: guiding member
213a-1, 213a-2: position setting pin
213b-1, 213b-2: spring
214a, 214b: elastic member
220: module-forming block
221: coupling through-hole
230: coupling pin
231: head
232: coupling part
232a: thread

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
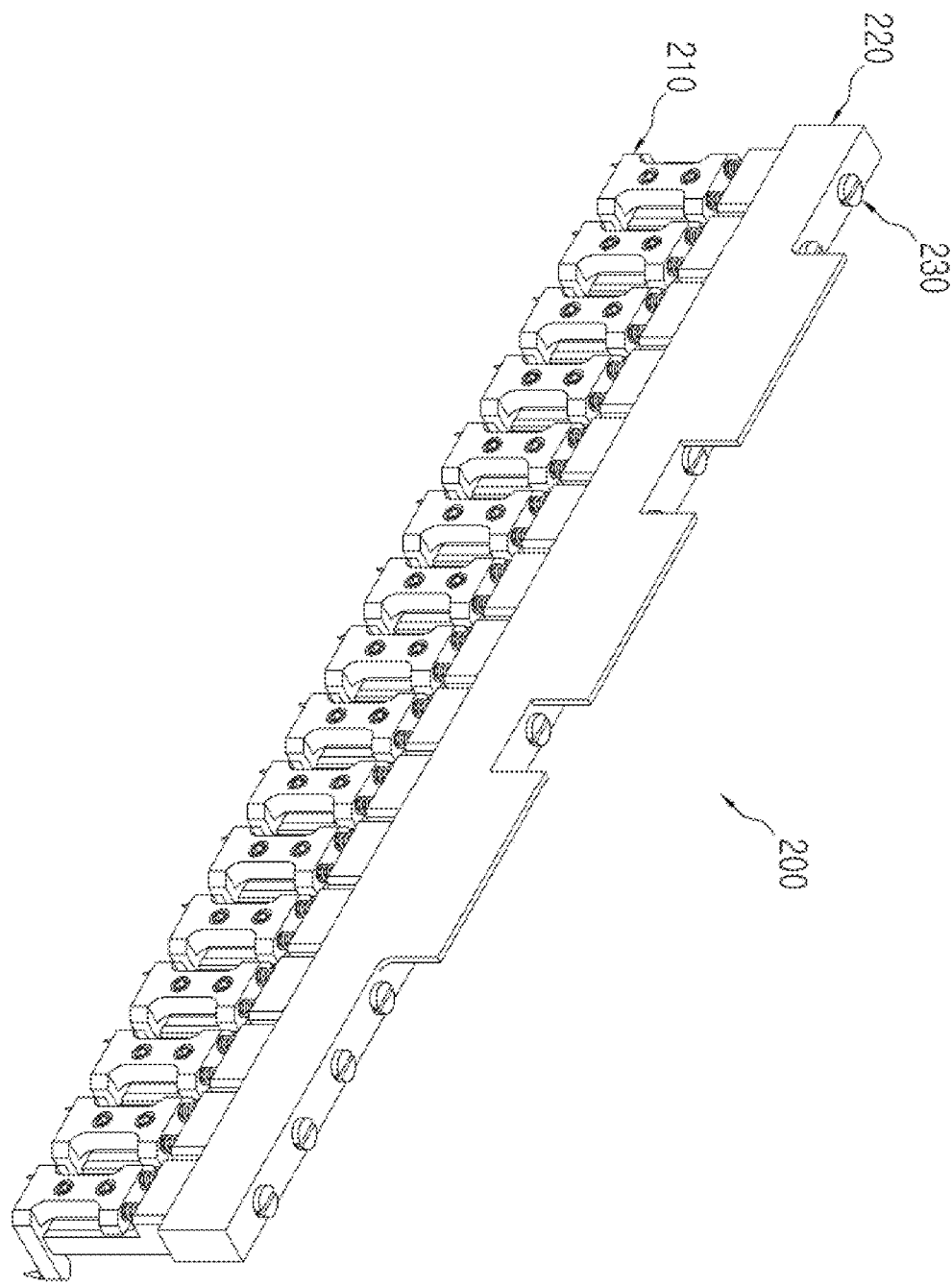
FIG. 2 is a perspective view illustrating a pick-and-place apparatus according to an embodiment of the present invention.

FIG. 2 is a perspective view illustrating a pick-and-place apparatus 200 according to an exemplary embodiment of the present invention.

Referring to FIG. 2, the pick-and-place apparatus 200 includes 16 picking apparatuses 210, a module-forming block 220, and coupling pins 230.

Figure 3:
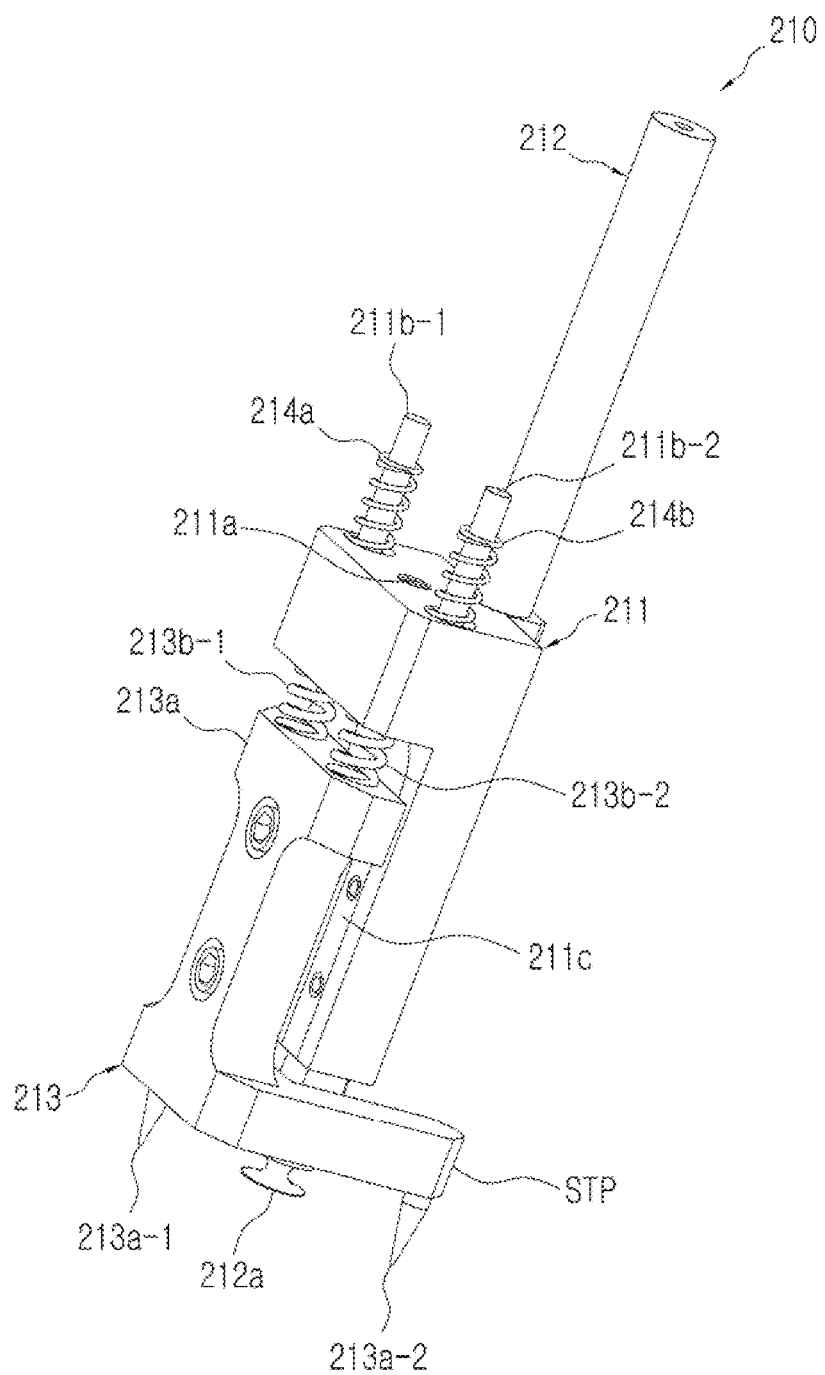
FIG. 3 is a perspective view illustrating a picking apparatus applied to the pick-and-place apparatus of FIG. 2 according to an exemplary embodiment of the present invention.

As shown in FIG. 3, each of the picking apparatuses 210 includes a body 211, a picker 212, a guiding unit 213, and a pair of elastic members 214a and 214b.

The body 211 is shaped as the letter 'L' viewed from the side. The body 211 is joined to the module-forming block 220 using coupling pins 230, so that the body 211 can move up and down, with being close to or far from the module-forming block 220 in a certain range of movement distance. The body 211 can be moved in one direction, i.e., toward a carrier board, and in the opposite direction thereto, i.e., toward the module-forming block 220. The body 211 forms threaded holes 211a for receiving the coupling pins 230 on its upper side. The body 211 includes a pair of guide bars 211b-1 and 211b-2 on the upper side, located at both opposite sides with respect to the threaded hole 211a, so that the guide bars 211b-1 and 211b-2 can guide the vertical movement of the body or prevent unintentional rotation of the picking apparatus 210. The body 211 is further cut off at its both sides, viewed from the front, and allows an LM guider 211c to be located at the cut-off portions. The LM guider 211c guides the vertical movement of a guiding member.

The picker 212 is joined with the body 211. The picker 212 includes a picking unit 212a for picking or releasing a semiconductor device at its lower end. The picking unit 212a is made of a flexible material.

The guiding unit 213 is located at the cut-off portions of the body 211. The guiding unit 213 is interacted with an insert of a carrier board and guides the picker 212 so that it can load a semiconductor device at a precise position in the carrier board.

The guiding unit 213 includes a guiding member 213a and a pair of springs 213b-1 and 213b-2.

The guiding unit 213 is shaped as the letter T viewed from the front. The guiding unit 213 is joined to the body 211, so that the guiding unit 213 can be guided by the LM guider 211c and thus be moved up and down with respect to the body 211 in a preset movement distance. The guiding unit 213 can be moved in one direction, i.e., toward a carrier board, and in an opposite direction thereto, i.e., toward the module-forming block 220. The guiding unit 213 further forms a stopper STP, shaped as the letter 'L' viewed from below, at its lower portion. While the body 211 is being lowered in a state where the lower surface of the stopper STP contacts the upper surface of the insert, the stopper STP serves to prevent the body 211 from being lowered after it has been lowered a certain distance, which will be explained in detail later.

The L-shaped stopper STP forms position setting pins 213a-1 and 213a-2 at both opposite ends of the letter 'L' on its lower surface, where the positions of the position setting pins 213a-1 and 213a-2 correspond to those of position setting holes that are formed on the diagonal line in the insert, which will be described in detail later.

Figure 4:
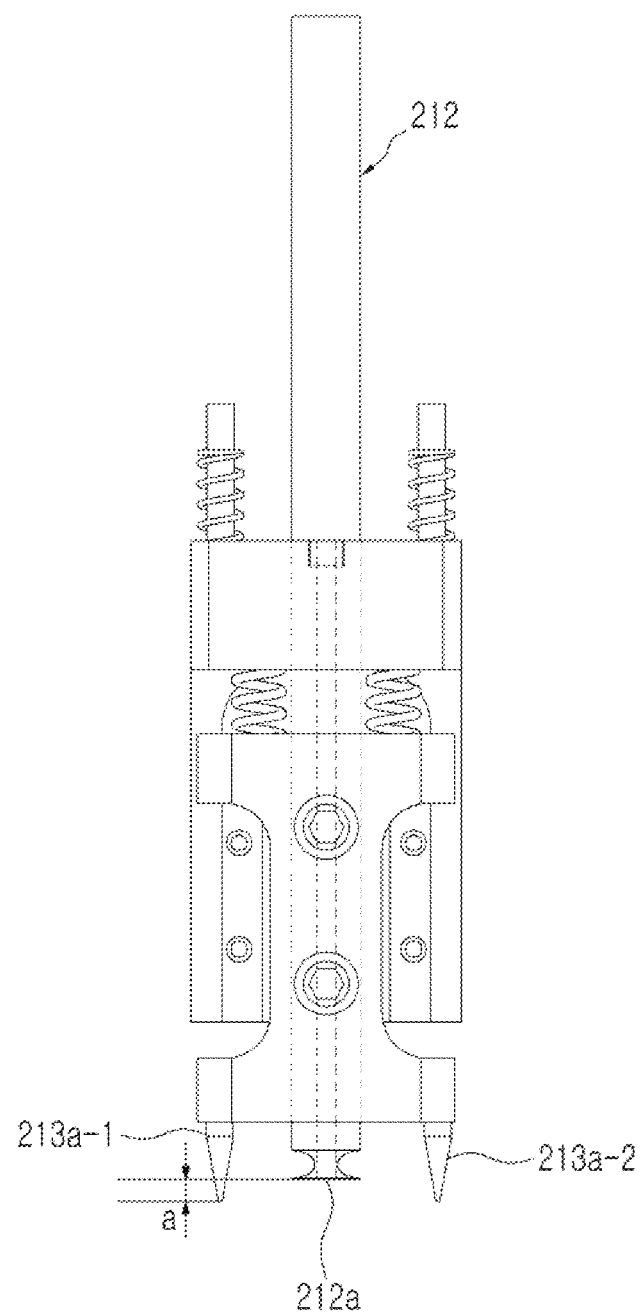
FIG. 4 is a front view of the picking apparatus of FIG. 3 according to an exemplary embodiment of the present invention.
Figure 5A:
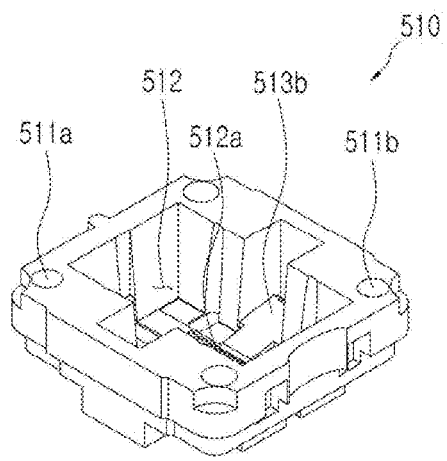
FIGS. 5A to 5D are views illustrating an insert corresponding to the picking apparatus of FIG. 3 according to an exemplary embodiment of the present invention.
Figure 5B:
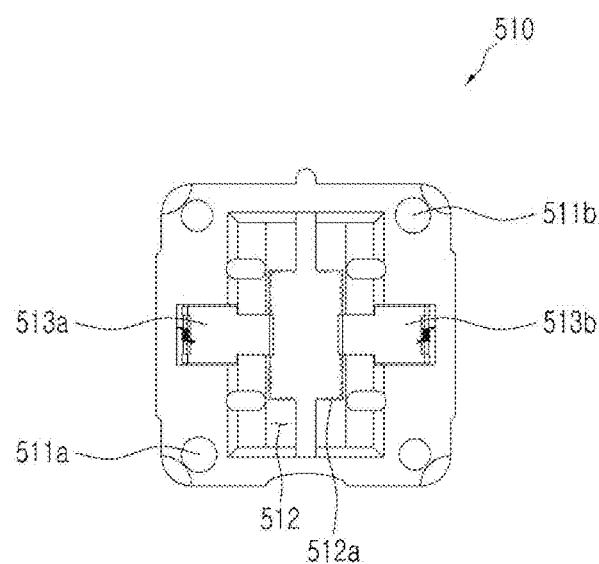

As shown in FIG. 5A (a perspective view illustrating an insert) and FIG. 5B (a top view illustrating the insert of FIG. 5A), the diameters and the spacing distance between the position setting pins 213a-1 and 213a-2 correspond to those of the position setting holes 511a and 511b of the insert 510, respectively. The position setting pins 213a-1 and 213a-2 are shaped as a circular cone at their end portion so the peak of the cone can allow the position setting pins 213a-1 and 213a-2 to be easily inserted into the position setting holes 511a and 511b although the centers between the position setting pins 213a-1 and 213a-2 and the position setting holes 511a and 511b are not completely aligned with each other. In addition, as shown in FIG. 4, the lower ends of the position setting pins 213a-1 and 213a-2 are protruded toward the carrier board by a length that is a longer than the lower end of the holding unit 212a of the picker 212. This is because the picker 212 and the carrier board, i.e., the picker 212 and the insert 510, can set their position first before the semiconductor device picked by the holding unit 212a is placed in the carrier board.

Referring to FIGS. 5A and 5B, the bottom side of the placement compartment 512 of the insert 510 is perforated. The inner wall around the perforated bottom side forms grooves 512a that are arranged, matching the shape and spacing of the balls of the semiconductor device. The area of the bottom side of the placement compartment 512 is much greater than the total area occupied by the balls of a semiconductor device, so that the insert can receive various sizes of semiconductor devices only if the position of their balls is standardized. For example, as shown in FIGS. 5C and 5D, although semiconductor devices $D_1$ and $D_2$ have different areas $S_1 \times L_1$ and $S_1 \times L_1$, respectively, they can be placed in the same insert 510 only if the position and shape of the ball 1b, serving as an electrical contact lead, are standardized.

Figure 5C:
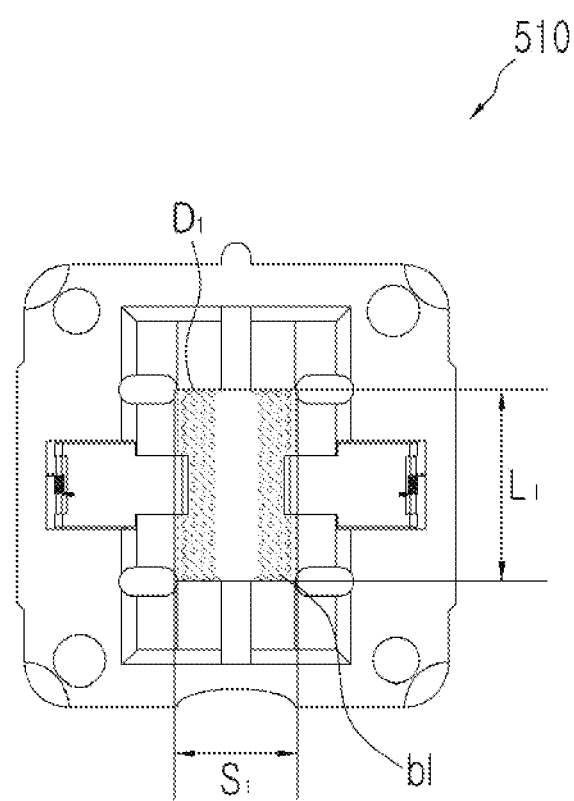
Figure 5D:
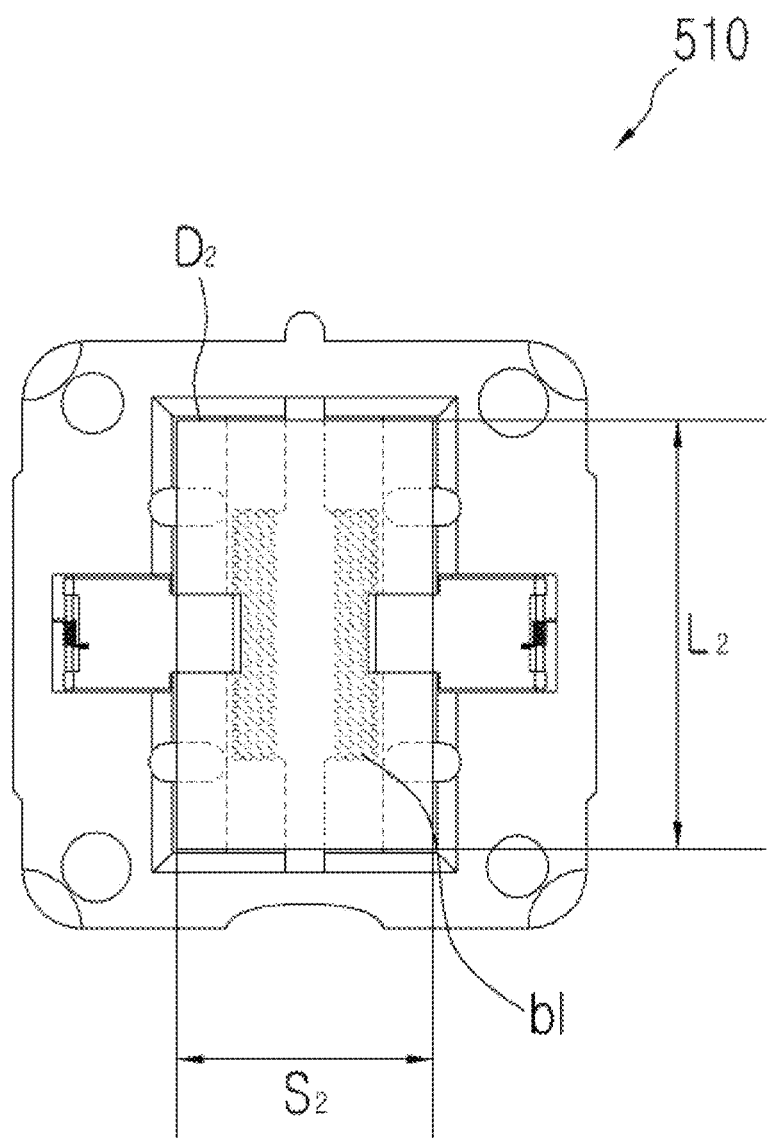

In an embodiment of the present invention as shown in FIGS. 5C and 5D, although the balls of a semiconductor device are inserted into all the grooves 512a formed in the bottom side of the placement compartment 512, it should be understood that the present invention is not limited to the embodiment. For example, if different semiconductor devices have the same sized balls spaced apart with the same spacing, they can be placed in the placement compartment 512 as the balls of each of the semiconductor devices are inserted into the grooves 512a formed in at least only one side of the bottom side of the placement compartment 512. Therefore, this structure enlarges the universality of the insert 510.

As shown in FIGS. 5A and 5B, holding apparatuses 513a and 513b hold a semiconductor device placed in the placement compartment 512.

Referring back to FIG. 3, the pair of springs 213b-1 and 213b-2 are placed between the guiding member 213a and the lower surface of the upper portion of the body 211. The pair of springs 213b-1 and 213b-2 exert an elastic force to the guiding member 213a in the lower direction (i.e., in the direction toward the carrier board).

The pair of elastic members 214a and 214b are configured to contain guide bars 211b-1 and 211b-2 inserted thereinto, respectively. The pair of elastic members 214a and 214b exert an elastic force in lower direction (i.e., in the direction toward the carrier board) by an elastic repulsive force between the module-forming block 220 and the picking apparatus 210. In an embodiment of the present invention, the pair of elastic members 214a and 214b are implemented with a coil spring. The pair of elastic members 214a and 214b have a much greater elastic coefficient than that of the pair of springs 213b-1 and 213b-2.

Figure 6:
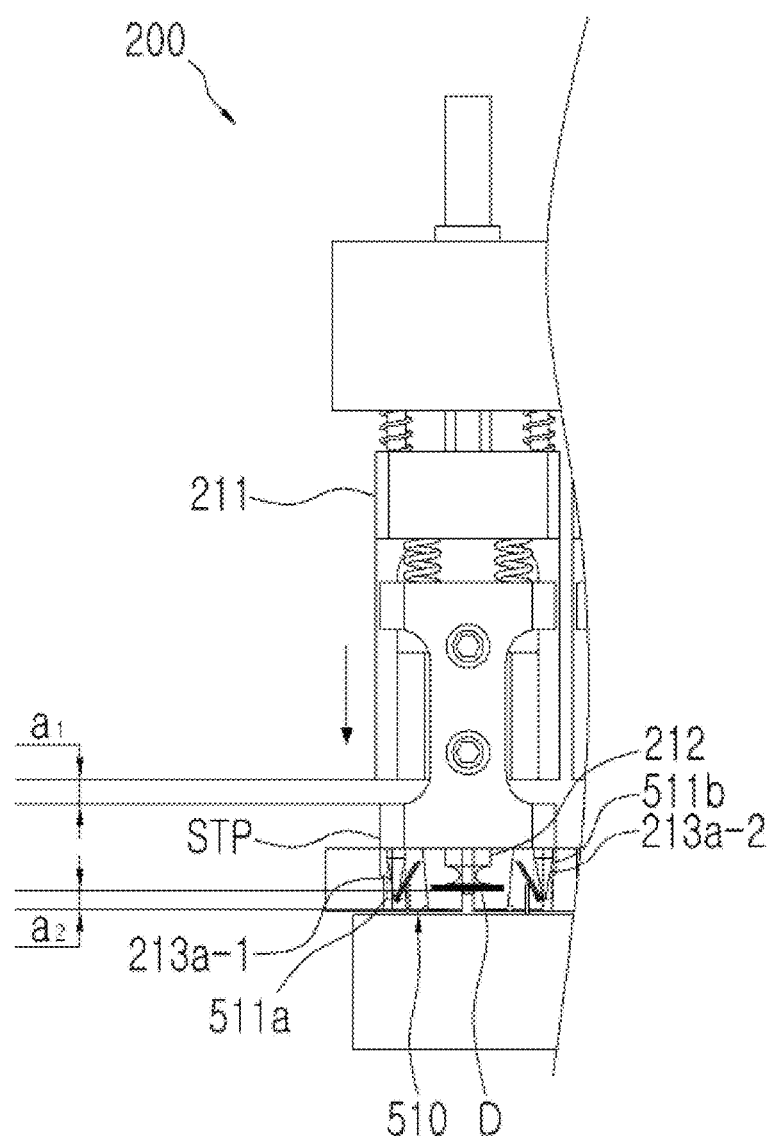
FIG. 6 and FIG. 7 are views that describe a coupling state of the pick-and-place apparatus of FIG. 2 according to an exemplary embodiment of the present invention.

The following description explains the function of the stopper STP with reference to FIG. 6.

As shown in FIG. 6, if the lower surface of the stopper STP contacts the upper surface of the insert 510, the position setting pins 213a-1 and 213a-2 cannot further enter the position setting holes 511a and 511b. As such, at the time that the lower surface of the stopper STP contacts the upper surface of the insert 510, it is preferable that the interval a1 between the upper surface of the stopper STP and the lower surface of the body 211 is equal to or a little greater than the interval a2 between the placement surface of the insert 510 and the lower surface of the semiconductor device picked by the picker 212.

Figure 7:
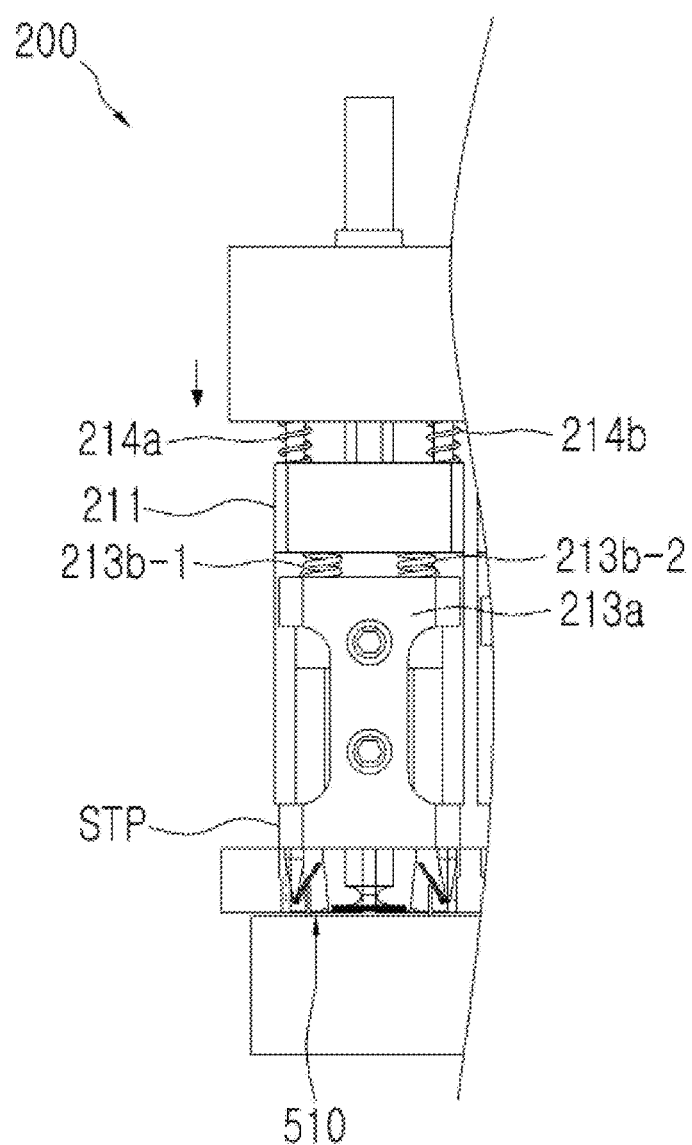

Referring to FIG. 7, after the lower surface of the stopper STP contacts the upper surface of the insert 510, the guiding member 213a cannot be further lowered by the stopper STP although the pick-and-place apparatus 200 continues to be lowered. Therefore, only the body 211 is lowered, by compressing the pair of springs 213b-1 and 213b-2.

If the lower surface of the body 211 being lowered contacts the upper surface of the stopper STP as shown in FIG. 7, the lowering operation of the body 211 is stopped. In this state, the continued lowering operation of the pick-and-place apparatus 200 causes the compression of the pair of elastic members 214a and 214b.

The module-forming block 220 serves to join 16 picking apparatuses 210 in one module. To this end, as shown in FIG. 8, the module-forming block 220 forms 16 coupling through-holes 221 in a vertical direction.

The module-forming block 220 also forms guiding holes 222a and 222b, through which the guide bars 211b-1 and 211b-2 pass, at both sides of each coupling through-hole 221.

Figure 8:
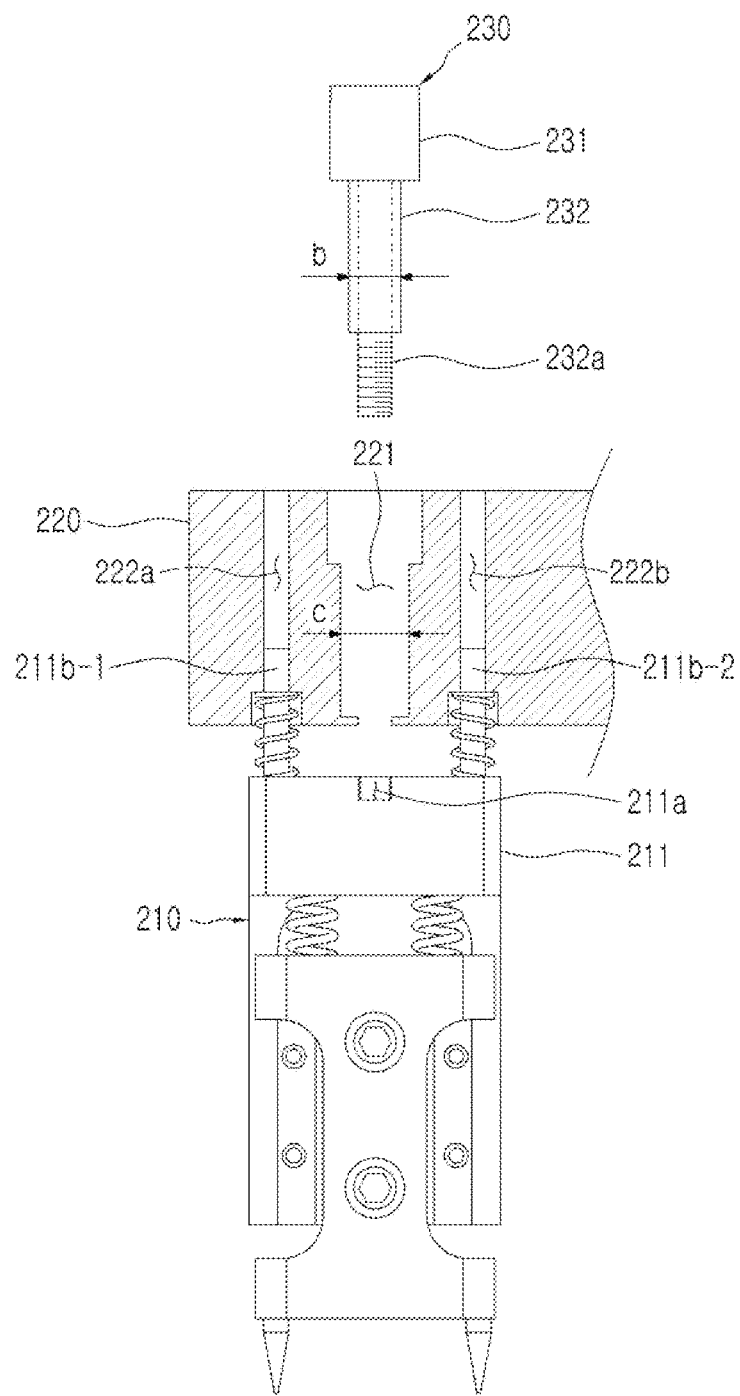
FIG. 8 to FIG. 18 are views that describe the operation of the pick-and-place apparatus according to an exemplary embodiment of the present invention.
Figure 9:
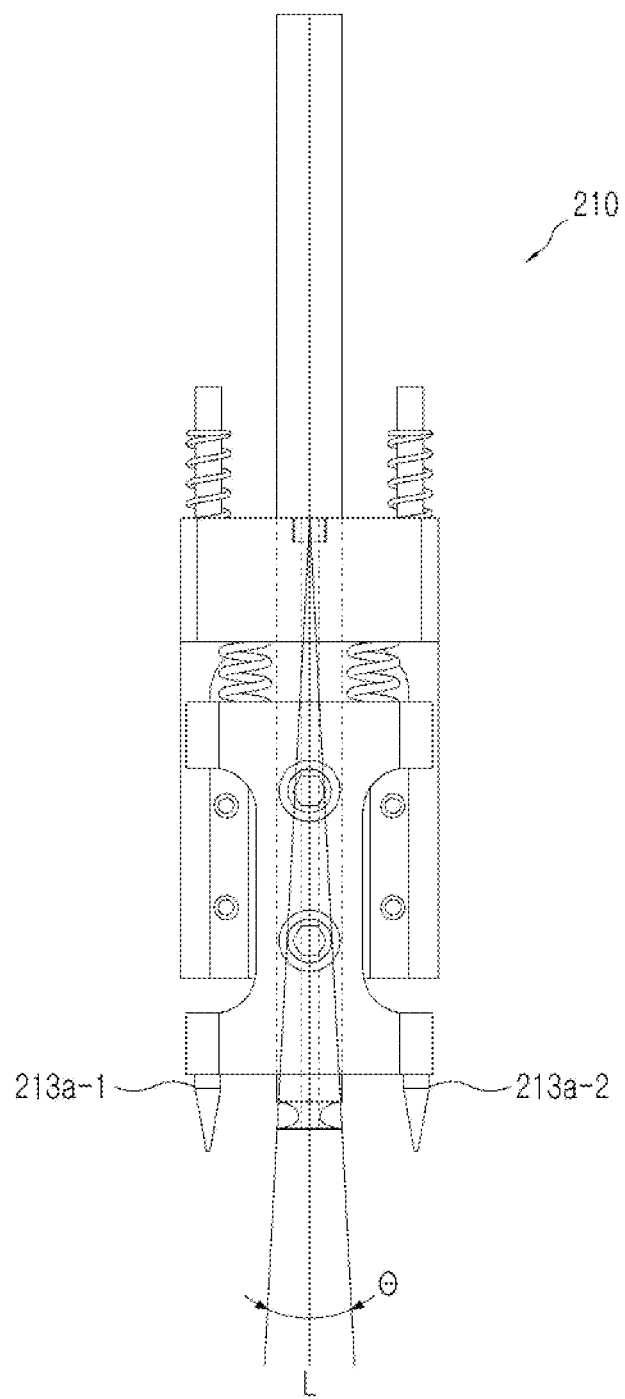
Figure 10:
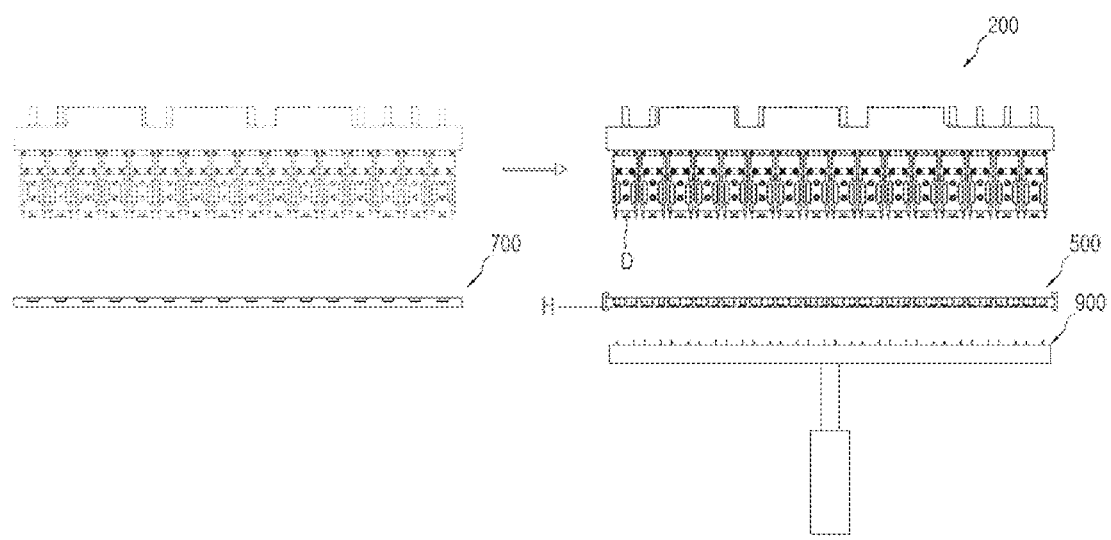
Figure 11:
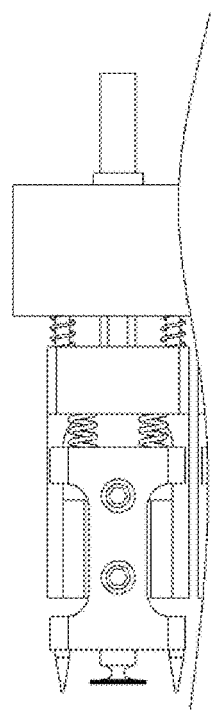
Figure 11:
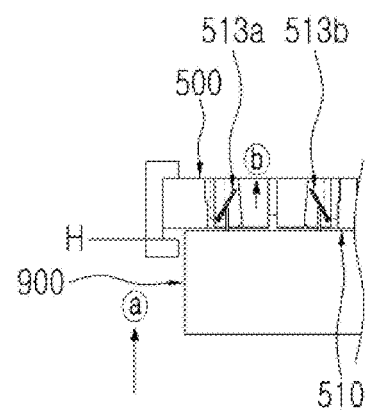

Referring to FIG. 8, the coupling pins 230 is formed with a head 221 and a coupling part 232. The coupling part 232 forms a thread on its lower portion. The coupling pins 230 pass through the coupling through-hole 221 and its lower portion is screwed into the threaded hole 211a of the body 211, thereby joining the picking apparatus 210 with the module-forming block 220. It is preferable that the external diameter b of the coupling part 232 is smaller than the internal diameter c of the coupling through-hole 221, i.e., b<c. This allows the picking apparatus 210 to be coupled to the module-forming block 220 with a flexible movement margin that is within range of angle θ with respect to the perpendicular line L passing the center of the module-forming block 220 toward the carrier board. Therefore, although the position setting pins 213a-1 and 213a-2 are not completely consistent with the center of the position setting holes 511 and 512, respectively, they can be smoothly inserted into the position setting holes 511 and 512.

If the internal diameter c of the coupling through-holes 221 is much smaller than the external diameter b of the coupling part 232, the clearance of the picking apparatus 210 is increased. It is preferable that the difference between the internal diameter c of the coupling through-hole 221 and the external diameter b of the coupling part 232 is 0.1~0.05 mm, experimentally. It should be understood that the difference between the internal diameter c of the coupling through-hole 221 and the external diameter b of the coupling part 232 may differ according to the vertical length of the pick-and-place apparatus or the length of the coupling pin.

The following description explains the operation of the pick-and-place apparatus 200, based on one picking apparatus 210, with reference to FIGS. 10 to 18.

1. Pick and Move Semiconductor Devices (Refer to FIG. 10)

The pick-and-place apparatus 200 sucks and picks up semiconductor devices D from a loading element 700, such as a customer tray, aligner, or the like, and moves them (in the direction of the arrow) above a carrier board 500 located a reference height H. The aligner, an example of the loading element 700, will be explained in detail later.

2. Release the Holding State of the Carrier Board (Refer to FIG. 11)

An opener 900, located at the lower side of the carrier board 500, rises (in the direction of arrow ⓐ) and operates the holding units 513a and 513b of the inserts 510 of the carrier board 500, thereby releasing the holding state of the holding unit 513a and 513b. When the opener 900 rises, the insert 510, installed to the carrier board 500, is lifted by h (refer to arrow ⓑ).

Figure 12:
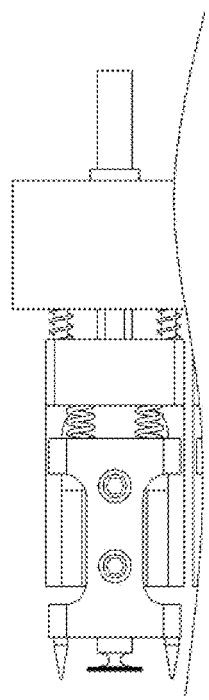
Figure 12:
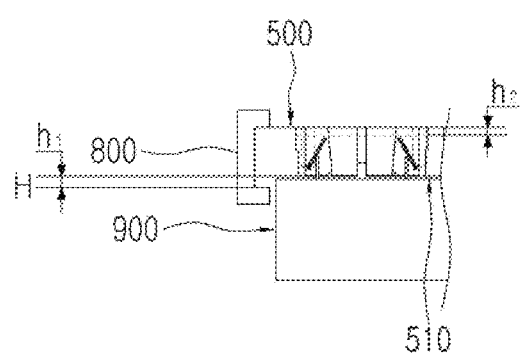

As exaggeratedly shown in FIG. 12, the carrier board 500 is equipped with a guide rail 800 on its lower surface. The lower surface is located at the reference height H with a vertical movement tolerance h1 by the guide rail 800. The guide rail 800 serves to prevent the separation of the carrier board 500 in the upper direction or lower direction. In addition, the insert 510 is also installed to the carrier board 500, so as to have a vertical movement tolerance $h_2$ ($h_2 = h - h_1$). In that case, the insert 510 can be ascended by the movement tolerance itself. Therefore, when the opener 900 rises, the insert 510 is ascended by h ($h = h_2 + h_1$)

Since technology related to openers is already well-known via various documents, for example, Korean Patent Registration No 10-0687676, etc., a detailed description is not included in this application.

3. Set Position Between Picker and Carrier Board (Refer to FIG. 13)

The pick-and-place apparatus 200 is lowered toward the carrier board 500 (refer to the arrow direction shown in FIG. 13) so that the position setting pins 213a-1 and 213a-2 are inserted into the position setting holes 511a and 511b. During this process, the positions between the insert 510 and the picker 212 that picks up a semiconductor device D are precisely set, so as to match the center between the picker 212 and the placement compartment 512 of the insert 510 (Since the picker picks up the center of the semiconductor device, the center of the semiconductor device can be coincident with that of the placement compartment).

4. Place and Hold Semiconductor Devices 4-1. Place Semiconductor Devices (Refer to FIG. 14)

Figure 13:
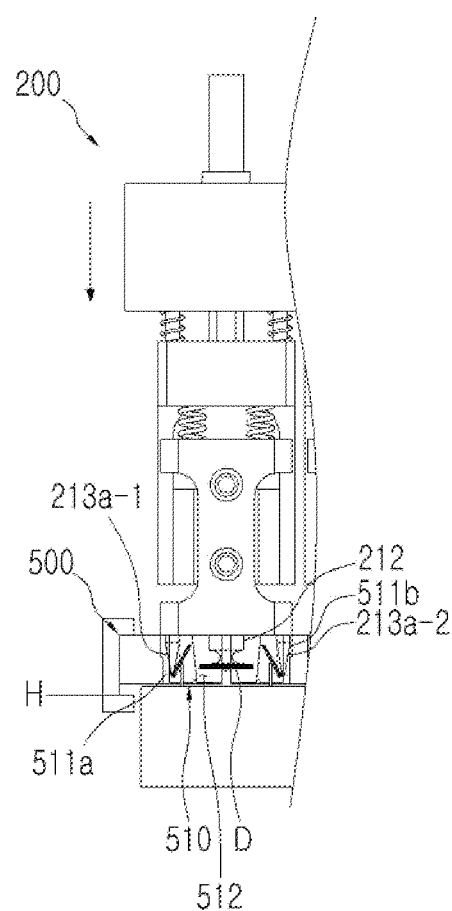

In a state where the positions between the picker 212 and the carrier board 500, i.e., the picker 212 and the insert 510, are precisely set as shown in FIG. 13, the pick-and-place apparatus 200 continues being lowered (refer to the arrow shown in FIG. 14), so that the semiconductor device D can be precisely placed at the correct position in the placement compartment 512. Since the lower surface of the stopper STP contacts the upper surface of the insert 510 before the semiconductor device D is placed in the placement compartment 512, the lowering operation of the pick-and-place apparatus 200 lowers only the picker 212 that is integrally coupled with the body 211. On the other hand, the guiding member 213a, which is relatively ascended with respect to the picker 212 but which is stopped actually, compresses a pair of springs 213b-1 and 213b-2 until the lower surface of the body 211 contacts the upper surface of the stopper STP.

4-2. Compress a Pair of Elastic Members (Refer to FIG. 15)

Figure 14:
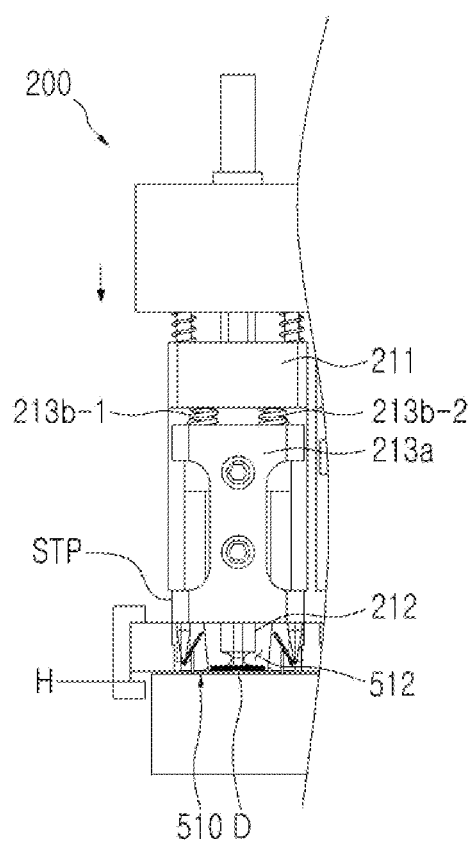
Figure 15:
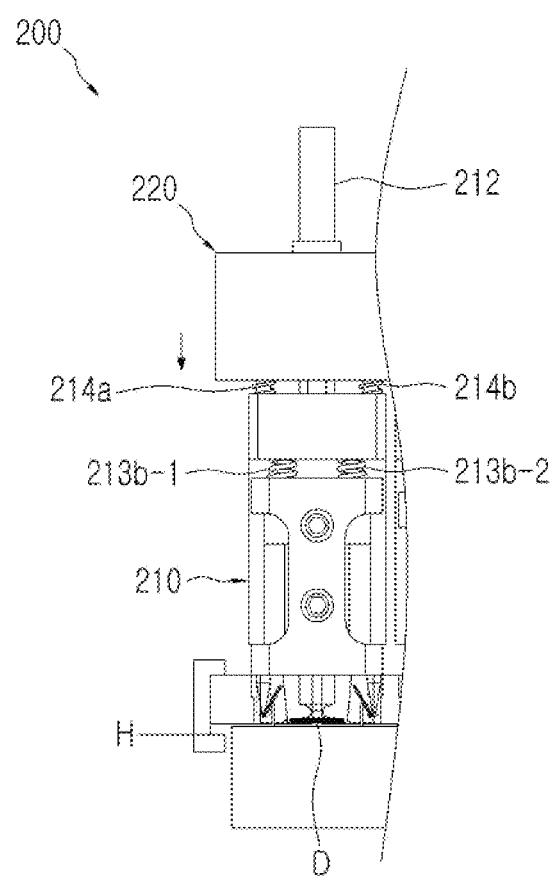

In a state where the guiding member 213a has relatively risen within a preset range of movement distance with respect to the picker 212 and thus the pair of springs 213b-1 and 213b-2 are compressed as shown in FIG. 14, if the pick-and-place apparatus 200 continues to be lowered as shown in FIG. 15, the module-forming block 220 is lowered and a pair of elastic members 214a and 214b, located between the picking apparatus 210 and the module-forming block 220, are also compressed, so that the picking apparatus 210 is relatively ascended (but stopped actually) with respect to the module-forming block 220. Therefore, if the picking apparatus 210 has relatively risen within a preset range of movement distance with respect to the module-forming block 220 and thus the pair of elastic members 214a and 214b have been also compressed, the pick-and-place apparatus 200 stops its lowering operation.

The pick-and-place apparatus 200 does not perform an ascending/descending operation until the pick-and-place apparatus 200 loads the semiconductor device D in a state shown in FIG. 5 and then rises again. After that, the picker 212 is lowered according to an elastic force of the pair of elastic members 214a and 214b.

4-3. Continue Placing the Semiconductor Devices (Refer to FIG. 16)

Figure 16:
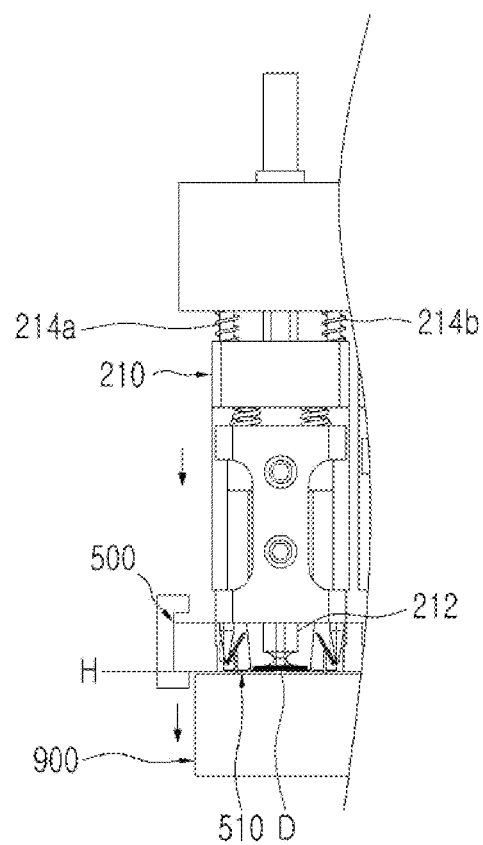
Figure 17:
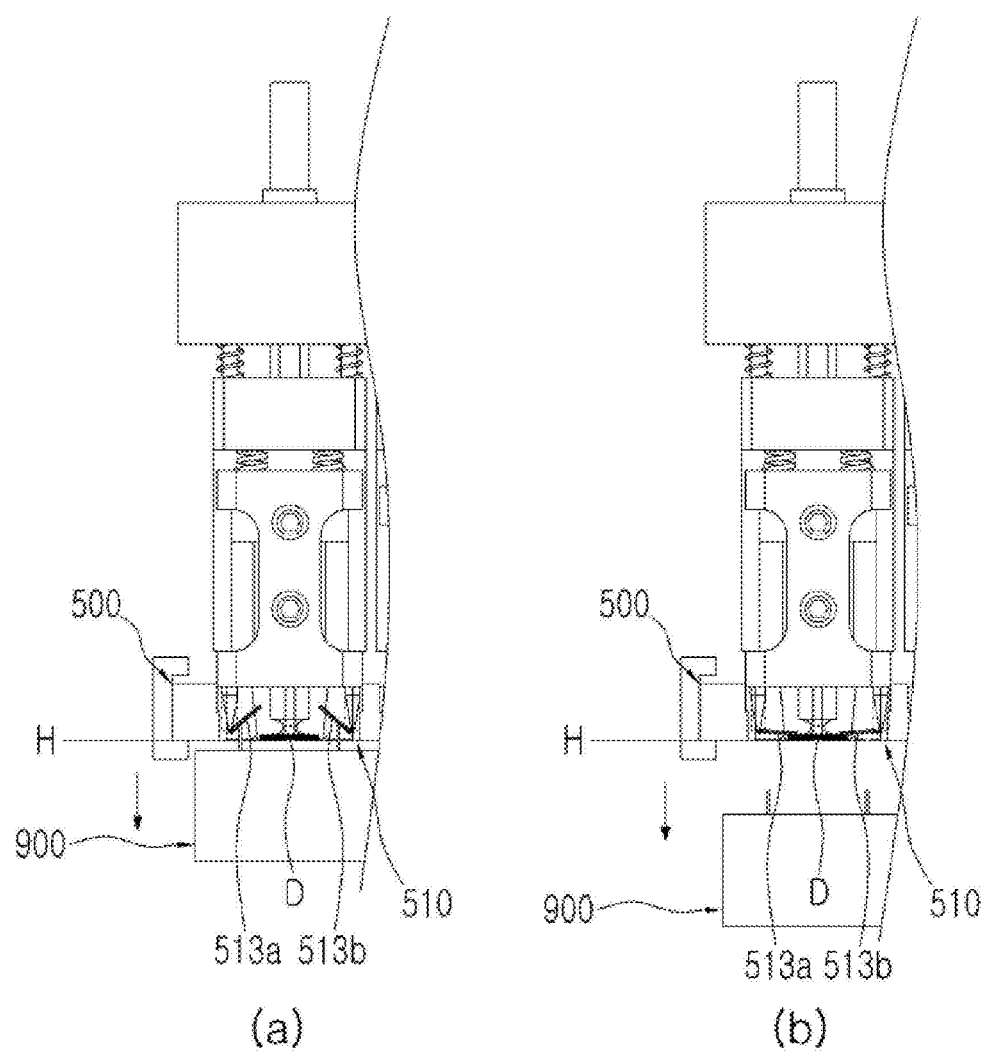
Figure 18:
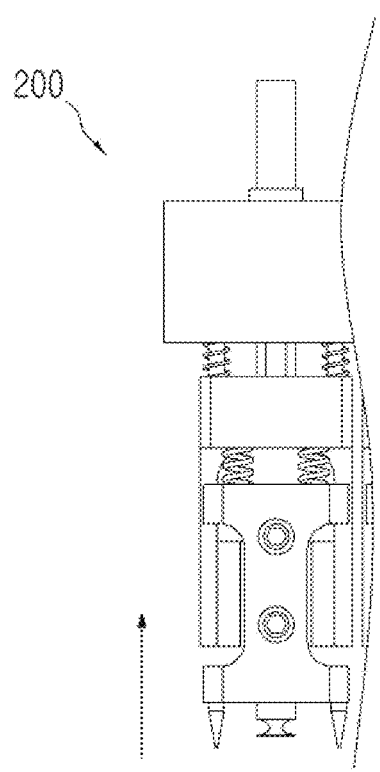
Figure 18:
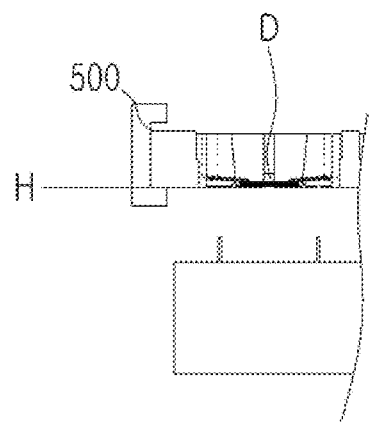

When the semiconductor device D is loaded from a correct placement position and the pair of springs 213b-1 and 213b-2 and the pair of elastic members 214a and 214b are compressed by preset lengths, respectively, the opener 900 is lowered in the direction of arrow as shown in FIG. 16 in order to hold the semiconductor device D. In that case, the insert 510 that rose by a height h as the opener 900 was rising lowers by a height h ($h = h_1 + h_2$, where $h_1$ is the lowered height of the carrier board 500 and $h_2$ is the lowered height of the insert 510). While the insert 510 is being lowered, the pair of elastic members 214a and 214b push the picking apparatus 210 in the lower direction, so that the picking apparatus 210 is lowered by a height h. Therefore, the semiconductor device D sucked and picked up by the picker 212 can continue pushing the placement side of the insert 510.

Since the picker 212 still sucks and picks up the semiconductor device D while the opener 900 is being lowered, the semiconductor device D can stably retain its placement state at the placement position even though a vibration according to the lowering operation of the opener 900 occurs.

4-4. Hold Semiconductor Devices (Refer to FIGS. 17A and 17B)

In a state where the carrier board 500 and the insert 510 have been lowered, if the opener 900 is further lowered in the direction of arrow, as shown in FIGS. 17A and 17B, the holding units 513a and 513b hold the semiconductor device D.

5. Release a Picking State of the Picker

When the holding units 513a and 513b have performed their holding operations, the vacuum pressure is released so that the picker 212 can release its sucking and picking state of the semiconductor device D.

6. Lift of the Pick-and-Place Apparatus (Refer to FIG. 18)

When the picker 212 releases the picking state of the semiconductor device D, the pick-and-place apparatus 200 is moved up opposite the carrier board 500, i.e., in the upper direction (refer to the direction of the arrow).

The following description explains the function of the aligner as a loading element of the pick-and-place apparatus 200.

The aligner refers to a loading element that arranges semiconductor devices before the pick-and-place apparatus 200 loads them onto the carrier board 500. The aligner must be configured to be applied to the pick-and-place apparatus 200 according to an embodiment of the present invention.

Figure 19:
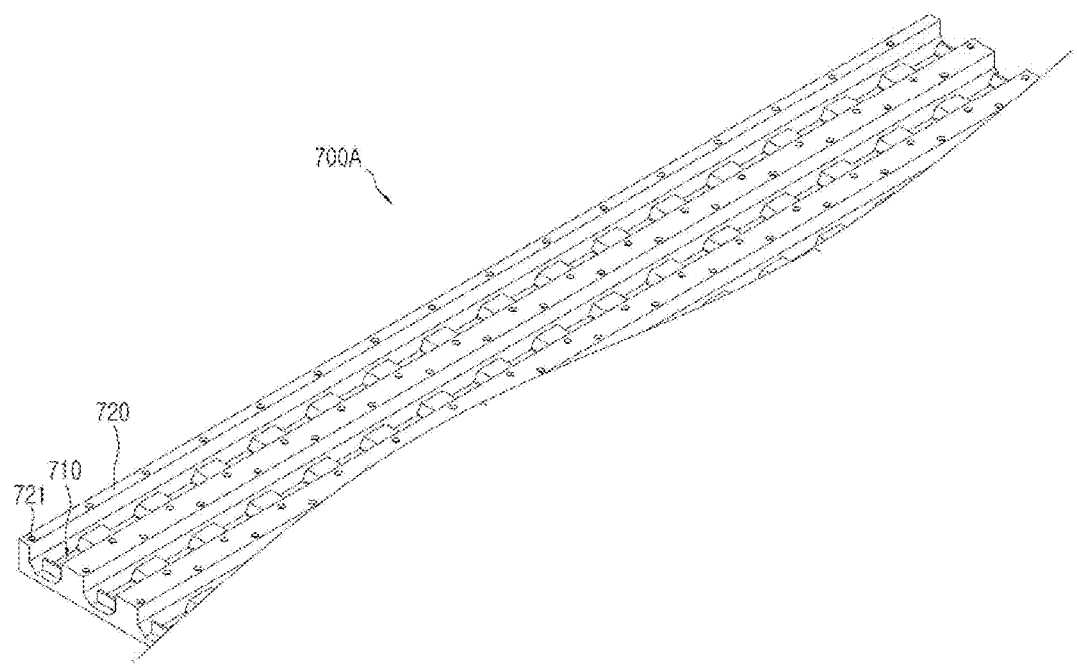
FIG. 19 is a view illustrating an aligner adapted to the pick-and-place apparatus according to an exemplary embodiment of the present invention.

FIG. 19 is a view illustrating an aligner adapted to the pick-and-place apparatus 200 according to an exemplary embodiment of the present invention.

Referring to FIG. 19, the aligner 700A forms a plurality of aligning grooves 710 on which semiconductor devices are loaded and aligned. At both sides of each aligning groove 710, pin receiving walls 720 are protrudently formed with a relatively high height. The pin receiving walls 720 form pin receiving holes 721 into which the position setting pins 213a-1 and 213a-2 of the pick-and-place apparatus 200 are inserted.

Figure 20:
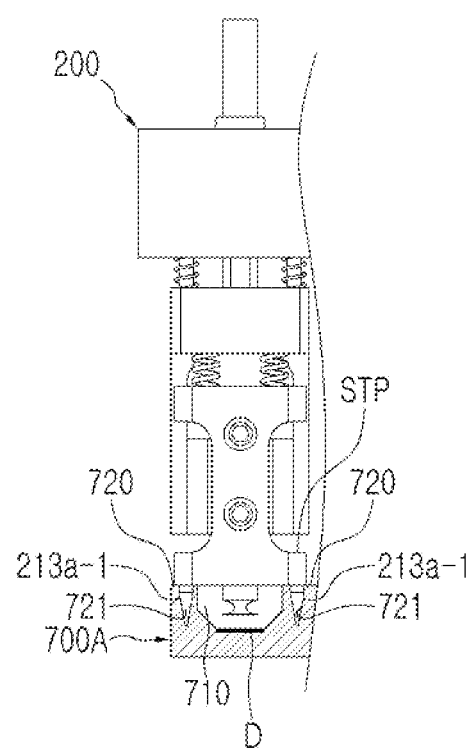
FIG. 20 and FIG. 21 are cross-sectional views that describe a method where the pick-and-place apparatus picks up semiconductor devices from the aligner, according to an exemplary embodiment of the present invention.

The following description explains a method where the pick-and-place apparatus 200 picks up semiconductor devices from the aligner 700A, with reference to FIG. 20.

Figure 21:
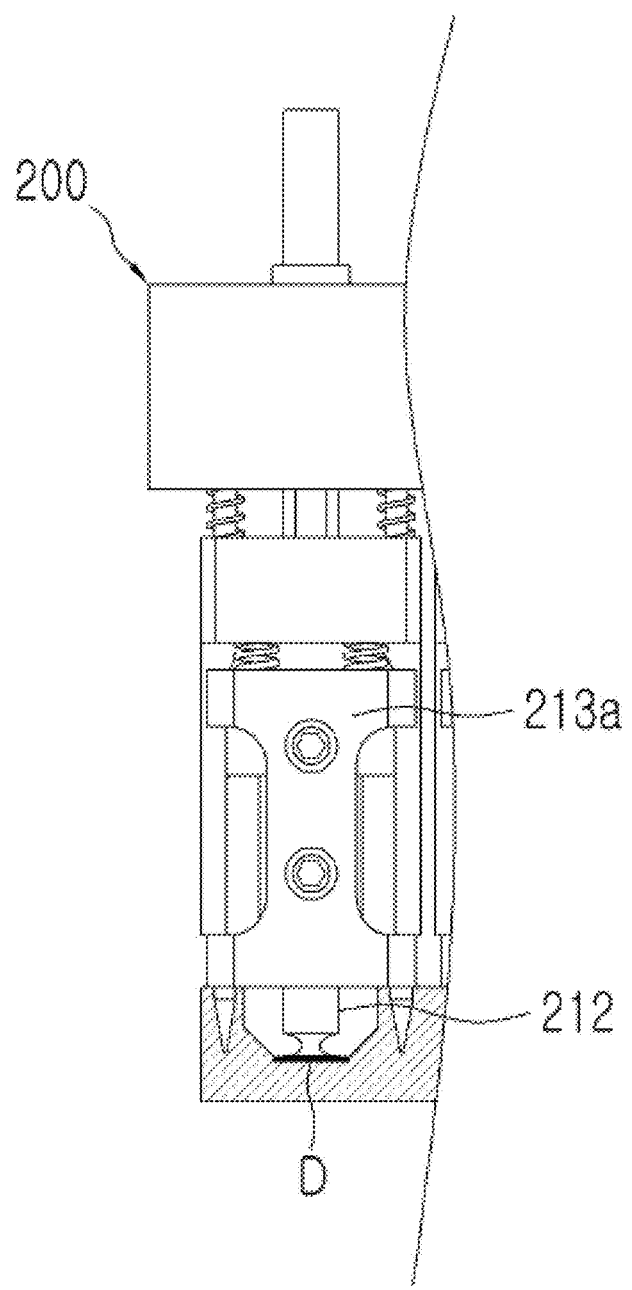

Referring to FIG. 20, when the pick-and-place apparatus 200 is lowered to pick up semiconductor devices loaded on the aligning grooves 710 of the aligner 700A, the position setting pins 213a-1 and 213a-2 are inserted into the pin receiving holes 721 and the lower surface of the stopper STP contacts the upper surface of the pin receiving wall 720. As shown in FIG. 21, according as the pick-and-place apparatus 200 continues lowering, the lowering operation of the guiding member 213a is stopped but only the picker 212 is still lowered, so that the picker 212 can pick up the semiconductor device D.

Although the embodiment of the present invention has been explained based on the pick-and-place apparatus 200 with 16 picking apparatuses 210, it should be understood that the present invention is not limited to the embodiment. For example, it can be modified in such a way that the pick-and-place apparatus can be equipped with a plurality of modules aligned in parallel, each module having 16 picking apparatuses.

As described above, the pick-and-place apparatus according to the present invention can precisely load and place semiconductor devices at a placement position in a loading element (in particular, in a carrier board), thereby guaranteeing the stability of the electrical contact between the semiconductor devices and the tester.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A pick-and-place apparatus for electronic device inspection equipment, the apparatus comprising:
    a plurality of picking apparatuses that pick up electronic devices loaded on a first loading element, move the electronic devices, and unloads the electronic devices onto a second loading element; and
    a module-forming block that joins the plurality of picking apparatuses in one module,
    wherein at least one picking apparatus comprises:
    a body fixed to the module-forming block;
    a picker having a picking unit, coupled to the body, for picking up an electronic device or releasing the picked electronic device; and
    a guiding unit for interacting with the second loading element and for guiding the picker to load the electronic devices at a correct position on the second loading element,
    wherein the guiding unit comprises a stopper at a lower portion of the guiding unit, the stopper formed around the picking unit,
    wherein the guiding unit comprises a guiding member having position setting pins, joined to the body, for setting positions between the picker and the second loading element by being inserted into position setting holes formed in the second loading element until a lower surface of the stopper contacts an upper surface of the second loading element and wherein the second loading element comprises a plurality of holding apparatuses to adjustably hold the electronic devices,
    wherein the guiding member is joined to the body so that it can be relatively moved within a preset range of movement distance with respect to the body in the direction of the second loading element or opposite thereto, and the guiding unit further comprises a first elastic member exerting an elastic force on the guiding member toward the second loading element, and
    wherein at least one picking apparatus further comprises a second elastic member for maintaining an elastic force with respect to the module-forming block, the second elastic member being joined so that it can be relatively moved within a preset range of movement distance with respect to the module-forming block in the direction toward the second loading element or opposite thereto, and the second elastic member has a greater elastic coefficient than the first elastic member does.

2. The apparatus according to claim 1, further comprising:
    coupling pins with a head and a coupling part for coupling at least one picking apparatus to the module-forming block, in which the coupling part forms a thread on at least one end portion thereof,
    wherein the module-forming block forms coupling through-holes for coupling at least one picking apparatus therewith, and the body forms a threaded hole into which the coupling part of the coupling pin passing through the coupling through-hole is screwed.

3. The apparatus according to claim 2, wherein the coupling part has an external diameter smaller than its internal diameter of coupling through-hole.

4. The apparatus according to claim 1, wherein the picking apparatus is coupled to the module-forming block in a certain range of angle with respect to a straight line passing through the module-forming block, the picking apparatus, and the second loading element.

5. The apparatus according to claim 1, wherein the first loading element comprises a plurality of aligning grooves in which the electronic devices are aligned and placed and pin receiving walls that are protrudent at both sides of the aligning groove, and
    wherein the pin receiving walls form position setting holes into which the position setting pins are inserted until a lower surface of the stopper contacts an upper surface of the pin receiving walls.

* * * * *